(12) United States Patent
Ecton et al.

(10) Patent No.: US 11,817,349 B2
(45) Date of Patent: Nov. 14, 2023

(54) CONDUCTIVE ROUTE PATTERNING FOR ELECTRONIC SUBSTRATES

(71) Applicant: INTEL CORPORATION, Santa Clara, CA (US)

(72) Inventors: Jeremy Ecton, Gilbert, AZ (US); Brandon C. Marin, Chandler, AZ (US); Leonel Arana, Phoenix, AZ (US); Matthew Tingey, Mesa, AZ (US); Oscar Ojeda, Chandler, AZ (US); Hsin-Wei Wang, Chandler, AZ (US); Suddhasattwa Nad, Chandler, AZ (US); Srinivas Pietambaram, Chandler, AZ (US); Gang Duan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 740 days.

(21) Appl. No.: 16/809,905

(22) Filed: Mar. 5, 2020

(65) Prior Publication Data

US 2021/0280463 A1    Sep. 9, 2021

(51) Int. Cl.
*H01L 21/768*   (2006.01)
*H01L 23/528*   (2006.01)
*H01L 23/532*   (2006.01)
*H01L 21/3213*  (2006.01)

(52) U.S. Cl.
CPC .... *H01L 21/76885* (2013.01); *H01L 21/7685* (2013.01); *H01L 21/76834* (2013.01); *H01L 21/76852* (2013.01); *H01L 23/528* (2013.01); *H01L 23/53238* (2013.01); *H01L 21/32134* (2013.01)

(58) Field of Classification Search
CPC ......... H01L 21/76885; H01L 21/76834; H01L 21/7685; H01L 21/76852; H01L 23/528; H01L 23/53238; H01L 21/32134; H01L 21/4853; H01L 23/49811; H01L 23/5283; H01L 23/5226; H01L 21/321
See application file for complete search history.

(56) References Cited

U.S. PATENT DOCUMENTS 10,964,792 B1 *   3/2021   Cheng .............. H01L 29/66795
2021/0082804 A1 * 3/2021   Wu .................. H01L 21/76843

* cited by examiner

*Primary Examiner* — Karen Kusumakar
(74) *Attorney, Agent, or Firm* — Essential Patents Group, LLP

(57) ABSTRACT

A conductive route for an integrated circuit assembly may be formed using a sequence of etching and passivation steps through layers of conductive material, wherein the resulting structure may include a first route portion having a first surface, a second surface, and at least one side surface extending between the first surface and the second surface, an etch stop structure on the first route portion, a second route portion on the etch stop layer, wherein the second route portion has a first surface, a second surface, and at least one side surface extending between the first surface and the second surface, and a passivating layer abutting the at least one side surface of the second route portion.

20 Claims, 6 Drawing Sheets

CONDUCTIVE ROUTE PATTERNING FOR ELECTRONIC SUBSTRATES

TECHNICAL FIELD

Embodiments of the present description generally relate to the field of integrated circuit package or assembly fabrication, and, more specifically, to the fabrication of conductive routes or metallization in electronic substrates used to route electrical signals for integrated circuit packages or assemblies.

BACKGROUND

Electronic substrates, used in the fabrication of integrated circuit devices, are generally composed of alternating layers of dielectric material (such as organic materials) and metal (such as copper) which is patterned to form conductive routes. At least one integrated circuit device, such as a silicon die having integrated circuitry formed therein, may be physically and electrically attached to the electronic substrate, such that the conductive routes in the electronic substrate appropriately routes electrical signals to and from the integrated circuitry of the integrated circuit device(s).

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the conductive routes within the electronic substrates, to which the integrated circuit devices are electrically attached, must also because smaller, in terms of pitch and line spacing (known as "line/space resolution"), as will be understood to those skilled in the art, in order to reduce the size of the integrated circuit packages or assemblies.

Wet subtractive etching processes are commonly used to fabricate conductive routes in electronic substrates, such as from layers of copper, as these processes are low cost and effective. However, these wet subtractive etching processes generally result in an undesirable lateral etching (undercut) which limits the patterning line/space resolution. Thus, current wet subtractive etching processes will not meet future demands needed to scale down the size of integrated circuit packages or assemblies.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
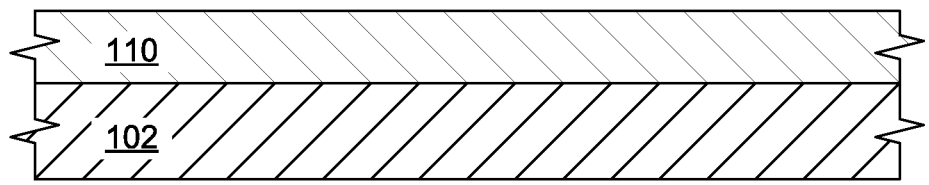
FIGS. 1-9 are side cross-sectional views of a process for the fabrication of conductive routes for an electronic substrate, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

For the purposes of the present disclosure, the term "high aspect ratio" means a structure has a height (z-direction) to width (x-direction) ratio of greater than about 2.

As previously discussed, existing wet subtractive etching process technologies used in the fabrication of conductive routes for electronic substrates will not meet future demands with regard to line/space resolution. Embodiments of the present description present processes and structures resulting therefrom allow for the use of a wet etching process while preventing potential issues with undercutting and improving line/space resolution. The embodiments of the present description may also enable the fabrication of high aspect ratio conductive routes while utilizing standard resist materials and lithography tools, which may not be possible utilizing conventional semi-additive plating (SAP) processes, materials, and tools. In particular, conventional SAP processes are subject to tradeoffs between line/space resolution and resist material thickness, as well as limitations in resist material development and stripping (e.g. capability scales with thickness). The embodiments of the present description do not have such limitations and may have substantially better feature (e.g. conductive route) thickness variation with regard the thickness of the feature is defined by current processes, such as a blanket plating process.

FIGS. 1-9 illustrate a process for fabricating a conductive route 100 for an electronic substrate for an integrated circuit assembly, according to an embodiment of the present description. As shown in FIG. 1, a first conductive material layer 110 may formed on a substrate 102. The substrate 102 may be any appropriate structure, such as a dielectric or a substrate core, as will be understood to those skilled in the art. The first conductive material layer 110 may be any appropriate conductive material, including, but not limited to, metals, such as copper, silver, nickel, gold, and aluminum, alloys thereof, and the like. In one specific embodiment of the present description, the first conductive material layer 110 may be copper.

Figure 2:
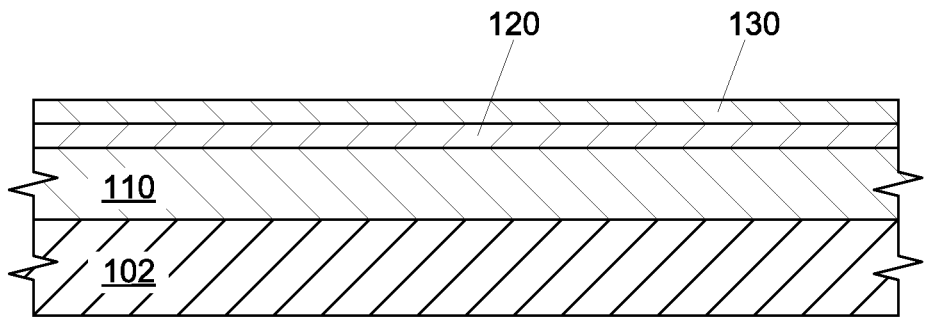

As shown in FIG. 2, an etch stop layer 120 may be formed on the first conductive material layer 110. Additionally, if the etch stop layer 120 is susceptible to oxidation, a capping layer 130 may be formed on the etch stop layer 120 to prevent such oxidation. The etch stop layer 120 may be any appropriate conductive material, including, but not limited to, metals, such as titanium, nickel, tin, gold, and the like. In one specific embodiment of the present description, the etch stop layer 120 may be titanium. The capping layer 130, if used, may be any appropriate conductive material that is less susceptible to oxidation than the etch stop layer 120. In one specific embodiment of the present description, the capping layer 130 may be copper.

Figure 3:
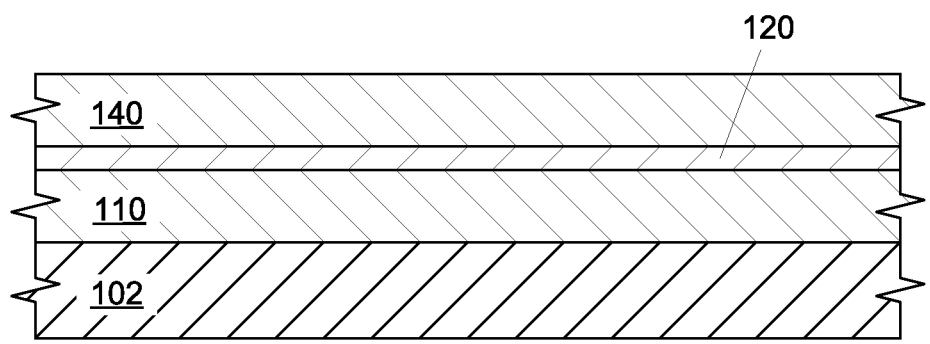

As shown in FIG. 3, a second conductive material layer 140 may formed on the etch stop layer 120. In one embodiment, the capping layer 130 (see FIG. 2), when used, may be subsumed into the second conductive material layer 140. The second conductive material layer 140 may be any appropriate conductive material, including, but not limited to, metals, such as copper, silver, nickel, gold, and aluminum, alloys thereof, and the like. In one specific embodiment of the present description, the second conductive material layer 140 may be copper. In one embodiment of the present description, the capping layer 130 may be substantially the same material as the second conductive material layer 140. In a further embodiment of the present description, the first conductive material layer 110 may be substantially the same material as the second conductive material layer 140.

Figure 4:
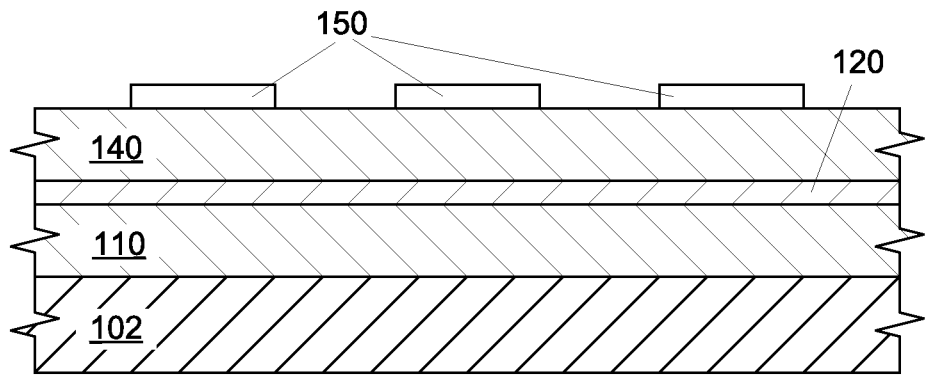

As shown in FIG. 4, an etch mask 150 may be patterned on the second conductive material layer 140. The etch mask 150 may be any appropriate material, such as known photoresist materials patterned by known lithographic techniques. The processes and structures for the formation of the etch mask 150 are well known in the art and, for the purposes of clarity and conciseness, will not be illustrated or discussed herein.

Figure 5:
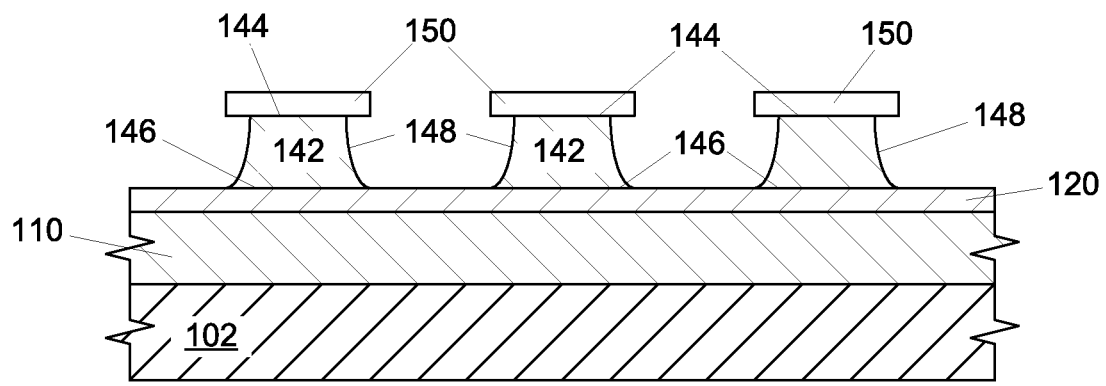

As shown in FIG. 5, the second conductive material layer 140 (see FIG. 4) may be wet etched through the etch mask 150 to form an upper or second conductive route portion 142 having a first surface 144 abutting the etch mask 150, an opposing second surface 146 adjacent the etch stop 120, and at least one side surface 148 extending between the first surface 144 and the second surface 146. As shown, the wet etch through the second conductive material layer 140 (see FIG. 4) stops on the etch stop layer 120. Thus, the etch is selective between the second conductive material layer 140 and the etch stop layer 120. The etchant for the wet etch may be any appropriate wet etch formulation. In one embodiment, when the second conductive material layer 140 (see FIG. 4) is copper, the etchant may be cupric chloride.

Figure 6:
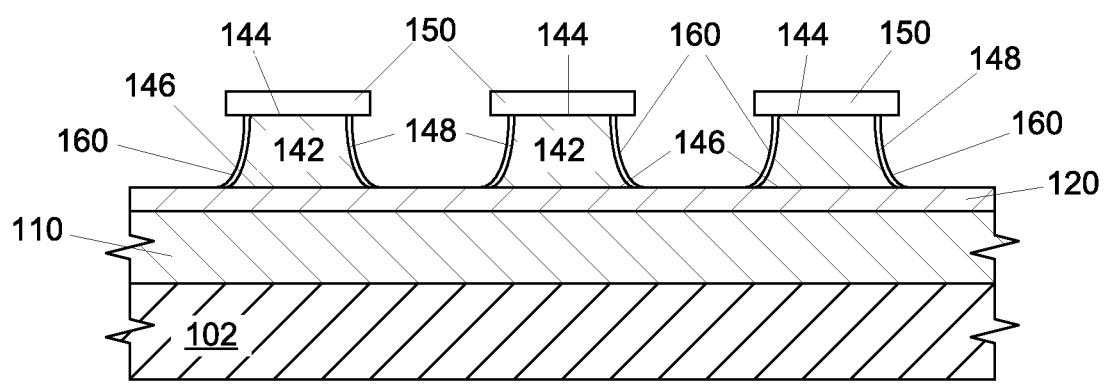

As shown in FIG. 6, a passivating layer 160 may be formed on the at least one side surface 148 of the second conductive route portion 142 to prevent etching during subsequent etching processes. The passivating layer 160 may be any appropriate material, including, but not limited to, an organic material (such as azole-based or thiol-based organics), a metal (such as nickel, tin, gold, and alloys thereof), and the like. In one embodiment, when an organic material is used for the passivating layer 160, the passivating layer 160 may be formed with an organic solderability preservation (OSP) tool. The material for the passivation layer 160 may be chosen to form selectively on the second conductive route portion 142 over the etch stop layer 120. In one embodiment, when the etch stop layer is titanium, the passivating layer 160 may formed selectively because the titanium will form a highly stable titanium oxide surface almost immediately upon exposure after the etching of the second conductive material layer 140. In another embodiment, the passivating layer 160 may comprise imidazole, which may form preferentially on copper over other metals, such as nickel or tin. Thus, it may be more cost effective to use nickel or tin as the etch stop layer 120 rather than using titanium, wherein the second conductive material layer 140 would be copper and the passivating layer 160 would be imidazole. In one embodiment, the material for the passivation layer 160 may be so selective that the passivation layer 160 does not contact the etch stop layer 120.

Figure 7:
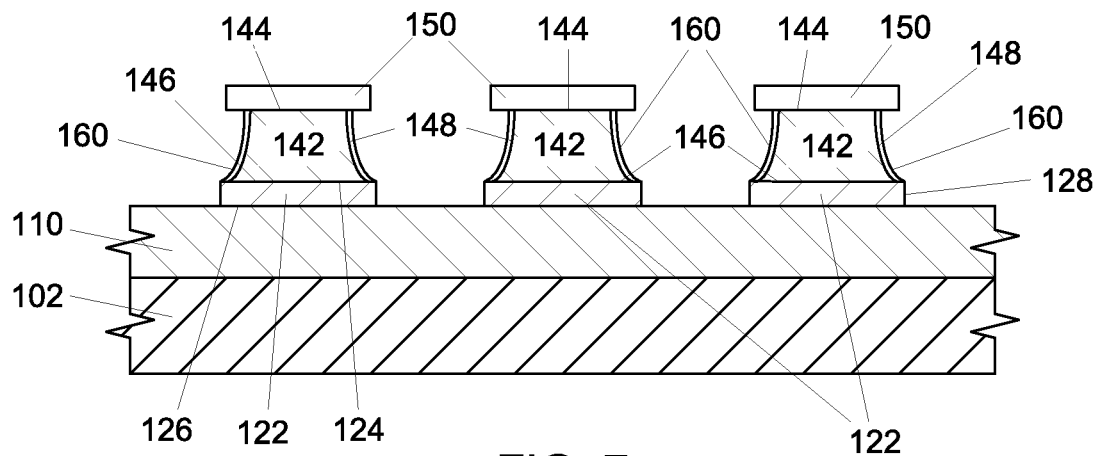

As shown in FIG. 7, the etch stop layer 120 (see FIG. 6) may be selectively etched through the etch mask 150 to form at least one etch stop structure 122 having a first surface 124 abutting the second conductive route portion 142, an opposing second surface 126 adjacent the first conductive material layer 110, and at least one side surface 128 extending between the first surface 124 and the second surface 126. As shown, the wet etch through the second conductive material layer 140 stops on the etch stop layer 130. Thus, the etch is selective between the second conductive material layer 140 and the etch stop layer 130. The etchant for the wet etch may be any appropriate wet etch formulation. In one embodiment, when the second conductive material layer 140 (see FIG. 4) is copper, the etchant may be cupric chloride.

Figure 8:
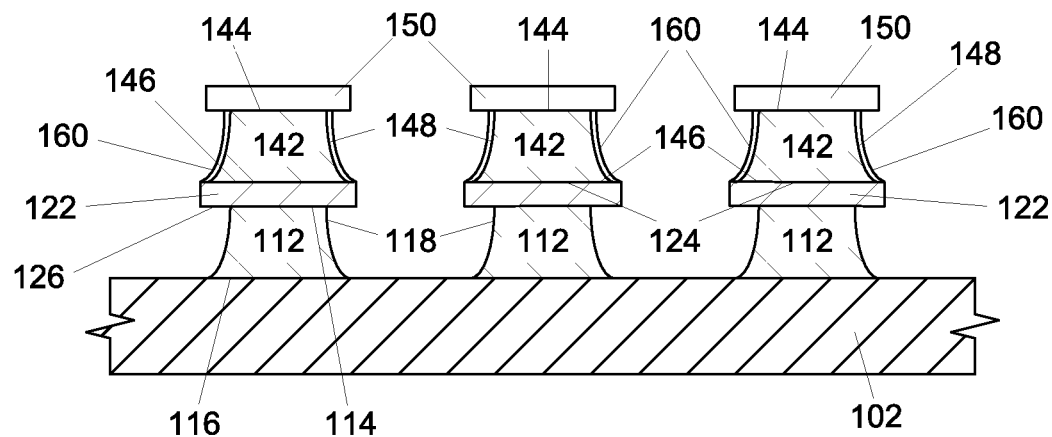
Figure 9:
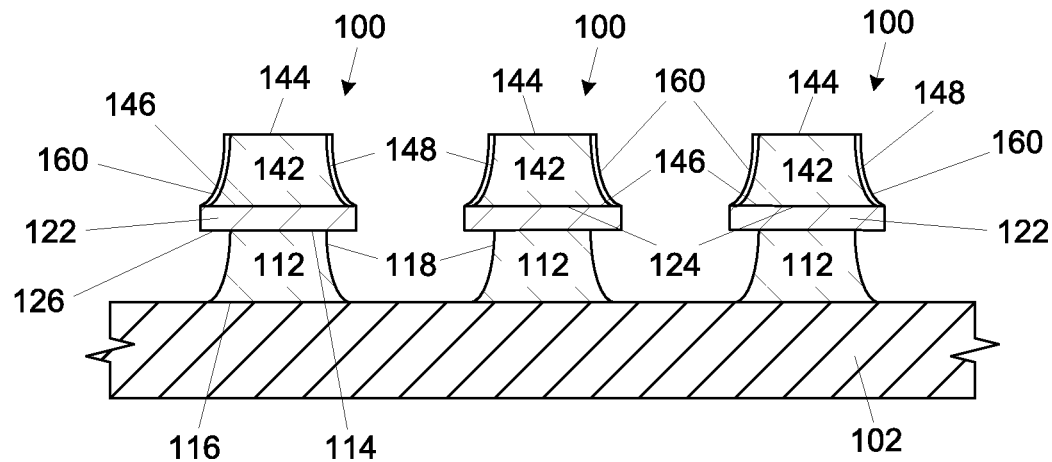
Figure 10:
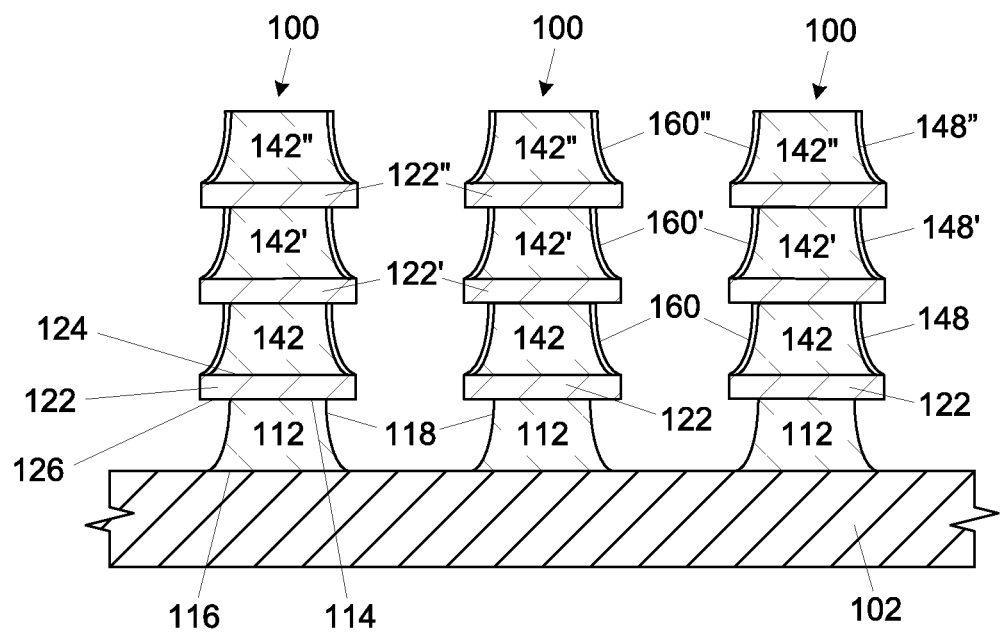
FIG. 10 is a side cross-sectional view of conductive routes for an electronic substrate, wherein the conductive routes each have four route sections, according to one embodiment of the present description.

As shown in FIG. 8, the first conductive material layer 110 (see FIG. 7) may be wet etched through the etch mask 150 to form a lower or first conductive route portion 112 having a first surface 114 abutting the etch stop 120, an opposing second surface 116 adjacent the substrate 102, and at least one side surface 118 extending between the first surface 114 and the second surface 116. The etchant for the wet etch may be any appropriate wet etch formulation. In one embodiment, when the first conductive material layer 140 (see FIG. 4) is copper, the etchant may be cupric chloride. As shown in FIG. 9, the etch mask 150 may be removed, resulting in at least one conductive route 100.

Although the conductive routes 100 of the embodiment illustrated in FIGS. 1-9 have two conductive route portions 112, 142 with an etch stop structure 122, the embodiments of the present description are not so limited. The conductive routes 100 may have any appropriate number of conductive route portions and etch stop structures, such as a first additional conductive route portion 140' on the second conductive route portion 140 with a first additional etch stop structure 122' therebetween, and a second additional conductive route portion 140" on the first additional conductive route portion 140' with a second additional etch stop structure 122" therebetween. These additional components may be fabricated used the techniques discussed with regard to FIGS. 1-9.

As will be understood, the embodiments of the present description allow for the fabrication of conductive routes for electronic substrates using low-cost wet etching processes, wherein the conductive routes may have improved line/space resolution with high aspect ratio patterns exceeding the industry standard semi-additive plating (SAP) process, while utilizing conventional materials and/or tools. Additionally, the embodiments of the present description provide a subtractive etch defined conductive route pattern that will have much lower thickness variation, which is a critical obstacle in standard SAP processes, as features continue to scale and design complexity increases. Additionally, cost savings may result from the fact that the embodiments of the present description can utilize low-cost stripping chemistries and resist materials. In one example, with regard to stripping chemistries, sodium hydroxide can be used instead of the more costly tetramethylammonium hydroxide and monoethanolamine, which are standard stripping chemistries used for SAP processes. Furthermore, with regard to resist materials, the embodiments of the present description can use thin resist materials to pattern thick copper features, such as conductive routes, instead of relying on high resolution and thick resists required for SAP processes. Additionally, the embodiments of the present description would not require costly plating additives to achieve low feature thickness variation, as in the case of SAP processes, since the thickness of features in the embodiments of the present description may defined by a blanket plating process.

Figure 11:
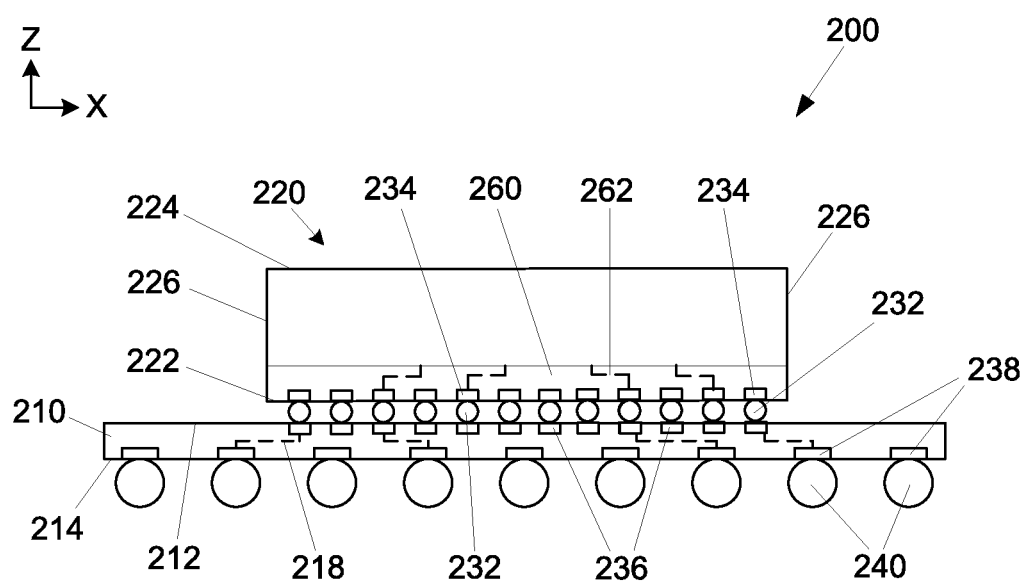
FIG. 11 is a side cross-sectional views of an integrated circuit package having an electronic substrate that contains at least one conductive route, according to an embodiment of the present description.

FIG. 11 illustrates an integrated circuit assembly 200 having at least one integrated circuit device 220 electrically attached to an electronic substrate 210 in a configuration generally known as a flip-chip or controlled collapse chip connection ("C4") configuration, according to an embodiment of the present description.

The electronic substrate 210 may be any appropriate structure, including, but not limited to, an interposer. The electronic substrate 210 may have a first surface 212 and an opposing second surface 214. The electronic substrate 210 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 210 may further include conductive routes 218 or "metallization" (shown in dashed lines) extending through the electronic substrate 210. As will be understood to those skilled in the art, the conductive routes 218 may be a combination of conductive traces (not shown) and conductive vias (not shown) extending through the plurality of dielectric material layers (not shown). These conductive routes 218 may include at least one conductive route 100 of the present description, as discussed with regard to FIGS. 1-10.

The integrated circuit device 220 may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 11, the integrated circuit device 220 may have a first surface 222, an opposing second surface 224, and at least one side 226 extending between the first surface 222 and the second surface 224. The integrated circuit device 220 may be a monolithic silicon die or plurality of molded composited dice.

The integrated circuit device 220 may include an interconnection layer 260 at the first surface 212 thereof. The interconnection layer 260 may comprise a plurality of dielectric material layers (not shown) conductive routes 262 or "metallization" (shown in dashed lines) extending through the interconnection layer 260. As will be understood to those skilled in the art, the conductive routes 262 may be a combination of conductive traces (not shown) and conductive vias (not shown) extending through the plurality of dielectric material layers (not shown). These conductive routes 262 may include at least one conductive route 100 of the present description, as discussed with regard to FIGS. 1-10.

In an embodiment of the present description, the first integrated circuit device 220 may be electrically attached to the electronic substrate 210 with a plurality of device-to-substrate interconnects 232. In one embodiment of the present description, the device-to-substrate interconnects 232 may extend between bond pads 236 on the first surface 212 of the electronic substrate 210 and bond pads 234 on the first surface 222 of the integrated circuit device 220. The device-to-substrate interconnects 232 may be any appropriate electrically conductive material or structure, including, but not limited to, solder balls, metal bumps or pillars, metal filled epoxies, or a combination thereof. In one embodiment, the device-to-substrate interconnects 232 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 232 may be copper bumps or pillars. In a further embodiment, the device-to-substrate interconnects 232 may be metal bumps or pillars coated with a solder material.

The bond pads 234 may be in electrical contact with the conductive routes 262, which may, in turn, be in electrical communication with integrated circuitry (not shown) within the integrated circuit device 220. The bond pads 236 on the first surface 212 of the electronic substrate 210 may be in electrical contact with the conductive routes 218. The conductive routes 218 may extend through the electronic substrate 210 and be connected to bond pads 238 on the second surface 214 of the electronic substrate 210. As will be understood to those skilled in the art, the electronic substrate 210 may reroute a fine pitch (center-to-center distance between the bond pads) of the integrated circuit device bond pads 236 to a relatively wider pitch of the bond pads 238 on the second surface 214 of the electronic substrate 210. In one embodiment of the present description, external interconnects 240 may be disposed on the bond pads 238 on the second surface 214 of the electronic substrate 210. The external interconnects 240 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 240 may be used to attach the integrated circuit assembly 200 to an external substrate (not shown), such as a motherboard.

Figure 12:
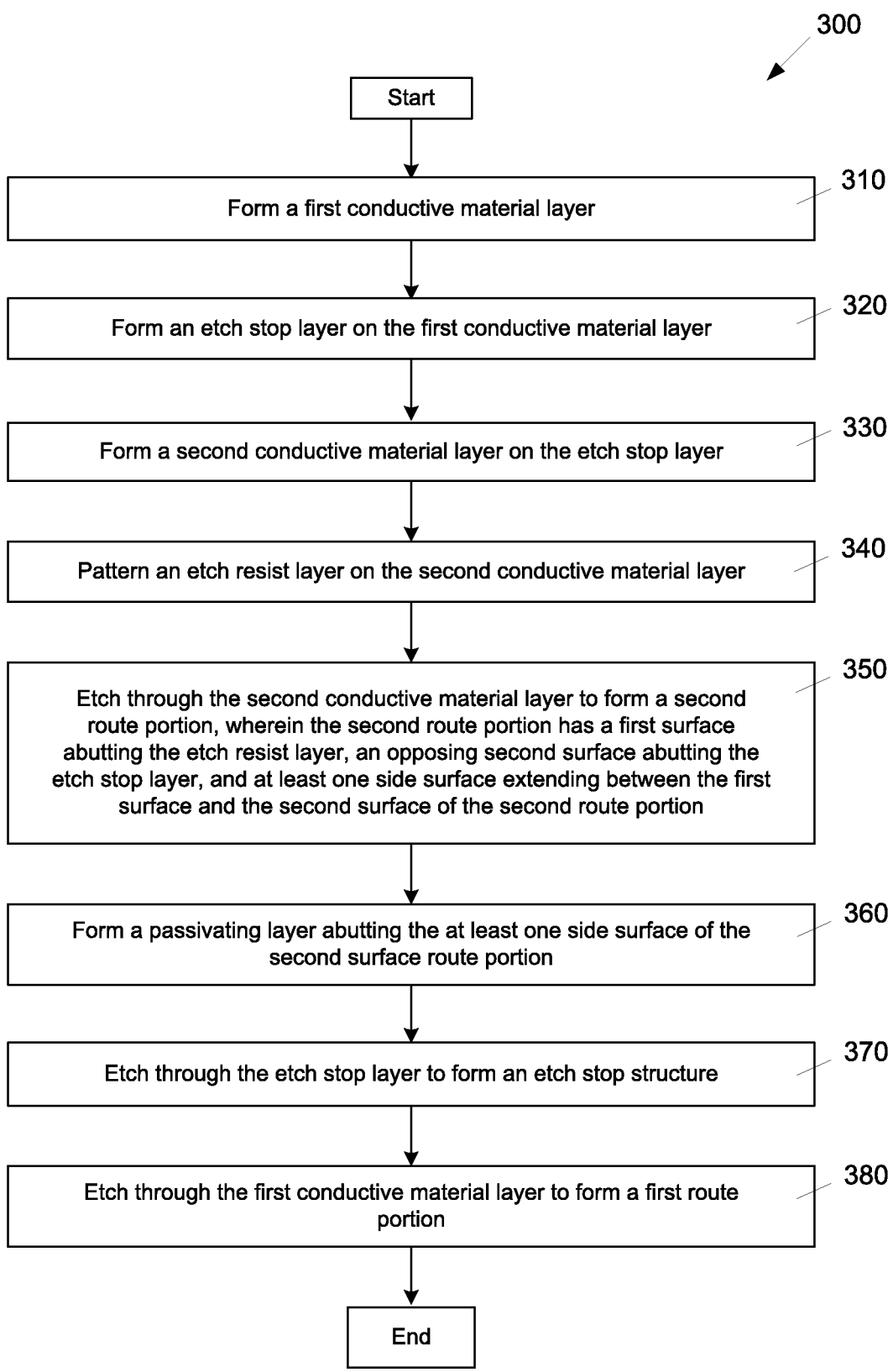
FIG. 12 is a flow chart of a process of fabricating a conductive route for an electronic substrate, according to an embodiment of the present description.

FIG. 12 is a flow chart of a process 300 of fabricating an integrated circuit assembly according to an embodiment of the present description. As set forth in block 310, a first conductive material layer may be formed. An etch stop layer may be formed on the first conductive material layer, as set forth in block 320. As set forth in block 330, a second conductive material layer may be formed on the etch stop layer. An etch resist layer may be patterned on the second conductive material layer, as set forth in block 340. The second conductive material layer may be etched to form a second route portion, wherein the second route portion has a first surface, an opposing second surface, at least one side surface extending between the first surface and the second surface of the second route portion, as set forth in block 350. As set forth in block 360, form a passivation layer abutting the at least one side surface of the second route portion. The etch stop layer may be etch to form an etch stop structure, as set forth in block 370. As set forth in block 380, the first conductive material layer may be etched to form a first route portion.

Figure 13:
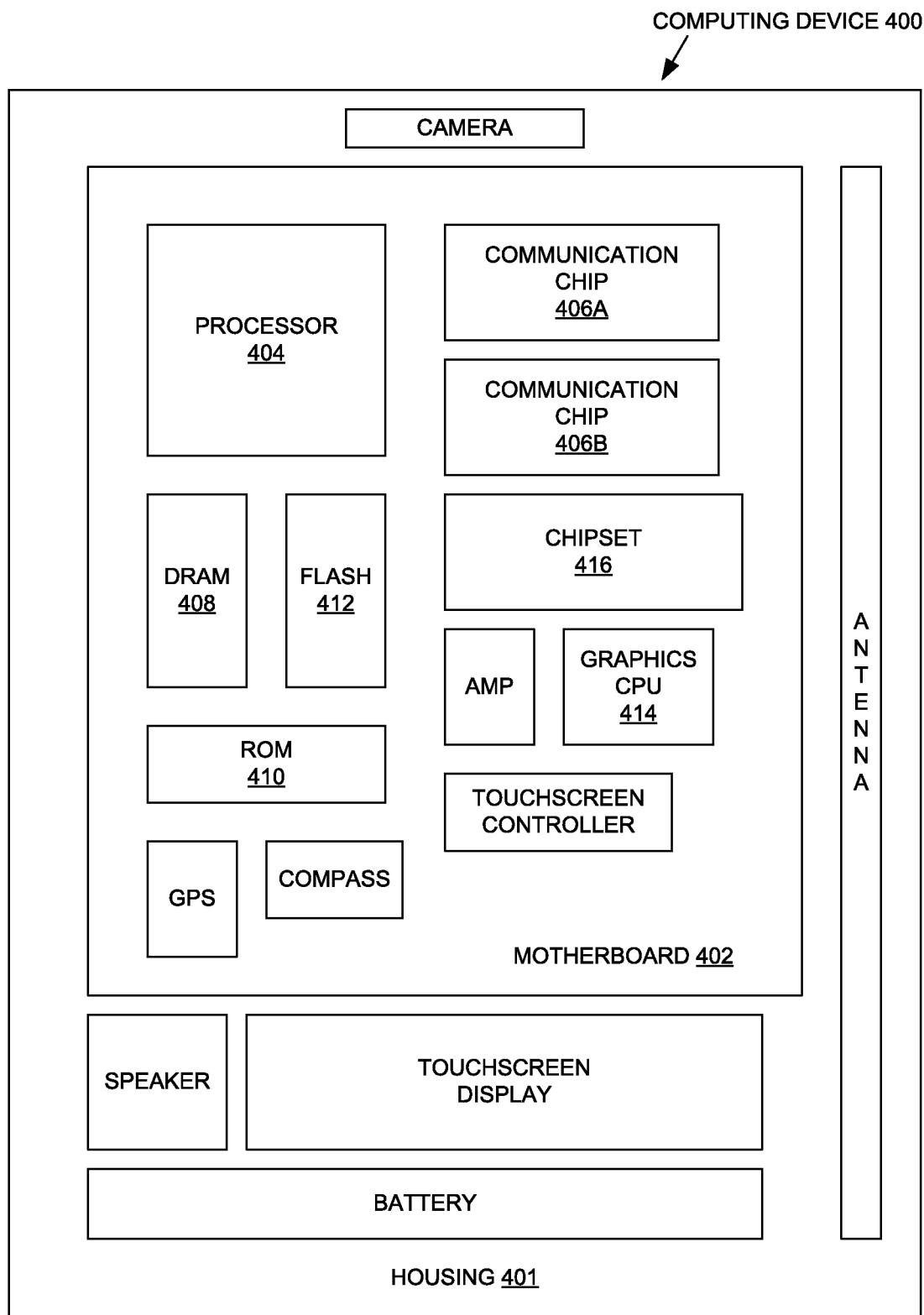
FIG. 13 is an electronic system, according to one embodiment of the present description.

FIG. 13 illustrates an electronic or computing device 400 in accordance with one implementation of the present description. The computing device 400 may include a housing 401 having a board 402 disposed therein. The computing device 400 may include a number of integrated circuit components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 402. In some implementations, at least one of the integrated circuit components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include a conductive route comprising a first route portion, wherein the first route portion has a first surface, an opposing second surface and at least one side surface extending between the first surface and the second surface of the first route portion, an etch stop structure on the first route portion, wherein the etch stop structure has a first surface and an opposing second surface and wherein the second surface of the etch stop structure abuts the first surface of the first route portion, a second route portion on the etch stop layer, wherein the second route portion has a first surface, an opposing second surface and at least one side surface extending between the first surface and the second surface of the second route portion and wherein the second surface of the second route portion abuts the first surface of the etch stop structure, and a passivating layer abutting the at least one side of the second route portion.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-13. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is a conductive route comprising a first route portion, wherein the first route portion has a first surface, an opposing second surface, at least one side surface extending between the first surface and the second surface of the first route portion, an etch stop structure on the first route portion, wherein the etch stop structure has a first surface and an opposing second surface and wherein the second surface of the etch stop structure abuts the first surface of the first route portion, a second route portion on the etch stop layer, wherein the second route portion has a first surface, an opposing second surface and at least one side surface extending between the first surface and the second surface of the second route portion and wherein the second surface of the second route portion abuts the first surface of the etch stop structure, and a passivating layer abutting the at least one side surface of the second route portion.

In Example 2, the subject matter of Example 1 can optionally include the first route portion having no passivating layer abutting the at least on side surface thereof.

In Example 3, the subject matter of any of Examples 1 to 2 can optionally include at least one of the first route portion and the second route portion comprising metal.

In Example 4, the subject matter of any of Examples 1 to 3 can optionally include the metal being copper.

In Example 5, the subject matter of any of Examples 1 to 4 can optionally include the etch stop structure being selected from the group consisting of titanium, nickel, tin, and gold.

In Example 6, the subject matter of any of Examples 1 to 5 can optionally include the passivating layer being selected from the group consisting of an azole-based polymer, a thiol-based polymer, nickel, tin, and gold.

In Example 7, the subject matter of any of Examples 1 to 6 can optionally include at least one additional route portion on the second route portion, wherein the additional route portion has a first surface, an opposing second surface, at least one side surface extending between the first surface and the second surface of the second route portion, and an additional passivating layer abutting the at least one side of the second route portion.

Example 8 is an electronic system, comprising an electronic board and an integrated circuit assembly electrically attached to the electronic board, wherein at least one of the integrated circuit assembly and the electronic board, includes a conductive route comprising a first route portion, wherein the first route portion has a first surface, an opposing second surface, at least one side surface extending between the first surface and the second surface of the first route portion, an etch stop structure on the first route portion, wherein the etch stop structure has a first surface and an opposing second surface and wherein the second surface of the etch stop structure abuts the first surface of the first route portion, a second route portion on the etch stop layer, wherein the second route portion has a first surface, an opposing second surface and at least one side surface extending between the first surface and the second surface of the second route portion and wherein the second surface of the second route portion abuts the first surface of the etch stop structure, and a passivating layer abutting the at least one side surface of the second route portion.

In Example 9, the subject matter of Example 1 can optionally include the first route portion having no passivating layer abutting the at least on side surface thereof.

In Example 10, the subject matter of any of Examples 8 to 9 can optionally include at least one of the first route portion and the second route portion comprising metal.

In Example 11, the subject matter of any of Examples 8 to 10 can optionally include the metal being copper.

In Example 12, the subject matter of any of Examples 8 to 11 can optionally include the etch stop structure being selected from the group consisting of titanium, nickel, tin, and gold.

In Example 13, the subject matter of any of Examples 8 to 12 can optionally include the passivating layer being selected from the group consisting of an azole-based polymer, a thiol-based polymer, nickel, tin, and gold.

In Example 14, the subject matter of any of Examples 8 to 13 can optionally include at least one additional route portion on the second route portion, wherein the additional route portion has a first surface, an opposing second surface, at least one side surface extending between the first surface and the second surface of the second route portion, and an additional passivating layer abutting the at least one side of the second route portion.

Example 15 is a method of fabricating a conductive route comprising forming a first conductive material layer, forming an etch stop layer on the first conductive material layer, forming a second conductive material layer on the etch stop layer, patterning an etch resist layer on the second conductive material layer, etching through the second conductive material layer to form a second route portion, wherein the second route portion has a first surface abutting the etch resist layer, an opposing second surface abutting the etch stop layer, and at least one side surface extending between the first surface and the second surface of the second route portion and wherein the second surface of the second route portion abuts the first surface of the etch stop structure, forming a passivating layer abutting the at least one side surface of the second route portion, etching through the etch stop layer to form an etch stop structure, and etching through the first conductive layer to form a first route portion.

In Example 16, the subject matter of Example 15 can optionally include forming a capping layer on the etch stop layer and wherein forming the second conductive material layer includes subsuming the capping layer into the second conductive material layer.

In Example 17, the subject matter of any of Examples 15 to 16 can optionally include forming at least one of the first route portion and the second route portion comprising forming a metal layer.

In Example 18, the subject matter of any of Examples 15 to 17 can optionally include forming the metal comprising forming a copper layer.

In Example 19, the subject matter of any of Examples 15 to 18 can optionally include forming the etch stop layer from a material selected from the group consisting of titanium, nickel, tin, and gold.

In Example 20, the subject matter of any of Examples 15 to 19 can optionally include forming the passivating layer from a material selected from the group consisting of an azole-based polymer, a thiol-based polymer, nickel, tin, and gold.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A conductive route, comprising:
a first route portion comprising copper;
an etch stop structure on and abutting a top surface of the first route portion, the etch stop structure comprising one of titanium, nickel, or gold;
a second route portion on and abutting a top surface of the etch stop structure, the second route portion comprising copper; and
a passivation layer abutting a side surface of the second route portion, wherein the passivation layer comprises one of an azole-based polymer or a thiol-based polymer.

2. The conductive route of claim 1, wherein the first route portion has no passivation layer abutting any surface thereof.

3. The conductive route of claim 1, wherein the etch stop structure comprises titanium.

4. The conductive route of claim 1, wherein the side surface of the second route portion extends between a top surface and a bottom surface of the second route portion, and wherein a lateral width of the bottom surface of the second route portion is greater than a lateral width of the top surface of the second route portion.

5. The conductive route of claim 4, wherein a side surface of the first route portion extends between the top surface and a bottom surface of the first route portion, and wherein a lateral width of the bottom surface of the first route portion is greater than a lateral width of the top surface of the first route portion.

6. The conductive route of claim 5, wherein the side surface of the first route portion and the side surface of the second route portion are concave side surfaces.

7. The conductive route of claim 1, further comprising an additional etch stop structure on the second route portion, an additional route portion on the addition etch stop structure, and an additional passivation layer abutting a side surface of the additional route portion.

8. A method of fabricating a conductive route, comprising:
   forming an etch stop layer on a first conductive material layer;
   forming a second conductive material layer on the etch stop layer;
   patterning an etch resist layer over the second conductive material layer;
   etching through the second conductive material layer to form a second route portion, wherein said etching stops on the etch stop layer;
   forming, after said etching through the second conductive material layer, a passivation layer abutting a side surface of the second route portion;
   etching, after said forming the passivation layer, through the etch stop layer to form an etch stop structure; and
   etching through the first conductive material layer to form a first route portion.

9. The method of claim 8, further comprising forming a capping layer on the etch stop layer, wherein said forming the second conductive material layer comprises subsuming the capping layer into the second conductive material layer.

10. The method of claim 8, wherein the first conductive material layer and the second conductive material layer comprise copper.

11. The method of claim 8, wherein the etch stop layer comprises one of titanium, nickel, tin, and gold.

12. The method of claim 8, wherein the passivation layer comprises one of an azole-based polymer or a thiol-based polymer.

13. An apparatus, comprising:
   an electronic board or an integrated circuit assembly comprising a conductive route, the conductive route comprising:
   a first route portion comprising copper;
   an etch stop structure on and abutting a top surface of the first route portion, the etch stop structure comprising one of titanium, nickel, or gold;
   a second route portion on and abutting a top surface of the etch stop structure, the second route portion comprising copper; and
   a passivation layer abutting a side surface of the second route portion, wherein the passivation layer comprises one of an azole-based polymer or a thiol-based polymer.

14. The apparatus of claim 13, wherein the first route portion has no passivation layer abutting any surface thereof.

15. The apparatus of claim 13, wherein the etch stop structure comprises titanium.

16. The apparatus of claim 13, wherein the side surface of the second route portion extends between a top surface and a bottom surface of the second route portion, and wherein a lateral width of the bottom surface of the second route portion is greater than a lateral width of the top surface of the second route portion.

17. The apparatus of claim 16, wherein a side surface of the first route portion extends between the top surface and a bottom surface of the first route portion, and wherein a lateral width of the bottom surface of the first route portion is greater than a lateral width of the top surface of the first route portion.

18. The apparatus of claim 17, wherein the side surface of the first route portion and the side surface of the second route portion are concave side surfaces.

19. The apparatus of claim 13, further comprising an additional etch stop structure on the second route portion, an additional route portion on the addition etch stop structure, and an additional passivation layer abutting a side surface of the additional route portion.

20. The apparatus of claim 13, comprising the electronic board electrically attached to the integrated circuit assembly, and further comprising:
   a display coupled to the electronic board.

* * * * *